(12) United States Patent
Glen et al.

(10) Patent No.: US 6,194,971 B1
(45) Date of Patent: Feb. 27, 2001

(54) METHOD AND APPARATUS FOR PHASE SHIFTING A CONTROLLED OSCILLATOR AND APPLICATIONS THEREOF

(75) Inventors: David Ian James Glen, North York; Hugh Hin-Poon Chow, Richmond Hill; Ray Chau; Philip Lawrence Swan, both of Toronto, all of (CA)

(73) Assignee: ATI Technologies, Inc., Thornhill (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/840,568

(22) Filed: Apr. 21, 1997

(51) Int. Cl.[7] .................................................. H03B 27/00
(52) U.S. Cl. .......................... 331/57; 331/1 A; 331/20; 331/45; 331/74; 331/49; 348/554; 345/213; 327/156
(58) Field of Search ....................... 331/1 A, 20, 57, 331/45, 34, 74, 49; 345/213; 327/156; 348/554

(56) References Cited

U.S. PATENT DOCUMENTS

| | | | |
|---|---|---|---|
| 5,268,656 | * 12/1993 | Muscavage | 331/45 |
| 5,394,116 | * 2/1995 | Katsuria | 331/34 |
| 5,854,576 | * 12/1998 | Swan | 331/57 |

* cited by examiner

*Primary Examiner*—Arnold Kinkead
(74) *Attorney, Agent, or Firm*—Markison & Reckamp, P.C.

(57) ABSTRACT

A method and apparatus for providing very small changes in the output oscillation of a controlled oscillation circuit, which may be used in a phase locked loop circuit, is accomplished by a phase-shifting controlled oscillator that includes an oscillation circuit and a selection circuit. The oscillation circuit generates a plurality of oscillations that are of approximately the same frequency and are approximately equally phase shifted from one another. The selection circuit is operably coupled to receive the plurality of oscillations and selects one of them to be the output oscillation based on a control signal. The very small change in the output oscillation occurs when the selection circuit, based on the control signal, selects another one of the oscillations to be the output oscillation. When the change happens, a single pulse is stretched by the phase difference between the "old" output oscillation and the "new" output oscillation.

18 Claims, 9 Drawing Sheets

METHOD AND APPARATUS FOR PHASE SHIFTING A CONTROLLED OSCILLATOR AND APPLICATIONS THEREOF

TECHNICAL FIELD OF THE INVENTION

This invention relates generally to phase locked loops and more particularly to a phase shifting controlled oscillator that may be used within a phase locked loop and other circuits.

BACKGROUND OF THE INVENTION

It would be an understatement to say that computers have changed our society. Computers have made it possible to communicate data around the world in seconds, have access to more information than any one person could assimilate in ten life times, and countless other advantages. And, advances in computer technology are occurring every day. For example, video image processing is making dramatic advances in picture quality for all types of image sources such as multimedia imaging, video conferencing, video games, VCR (video cassette recorder), broadcast television, cable television, and DVD (digital video disks), to name just a few.

Displaying video images that were specifically designed to be displayed on a computer display can be done with the utmost of clarity. For example, still images and computer graphical interface images are displayed with great clarity on computer displays where the display refresh (or update) rate is set by standards bodies which may be 60 Hz, 75 Hz, 90 Hz, or 100 Hz. Because of the static nature of these images, the number being prepared for display, or the image update rate, exactly match the display update rate (the number of images the display will present in a second). Similarly, for television, the incoming images have an image update rate that exactly matches the display update rate of the television. In North America the television display update rate is approximately sixty Hertz and in Europe the television display update is approximately fifty Hertz.

A difficulty arises when displaying images with very precise update rates and were not specifically designed to be displayed on a computer display, such as images from television broadcasts, VCRs, DVDs, and cable television broadcasts. These video transmission mediums have their own image update rates. For example, North American television has an image update rate of 59.94 Hz, while European television has an image update rate of 50 Hz, and motion pictures have an image update rate of 24 Hz. Due to the differences between the image update rate of these video image mediums and the display update rate of the computer display, which are very small, update rate compensation is needed.

One update rate compensation technique is to drop or repeat an image when the timing between the image update rate and the display update rate is offset by an image (i.e., becomes a frame out of sync). When the image update rate is faster than the display update rate, images need to be dropped (i.e., not shown). While this keeps the image update rate in sync with the display upte rate, the dropping of the images may be noticeable. For example, if the image that is dropped is one in a series of action images (an object is moving), there may be a noticeable jump in the movement of the object because of the dropped image. When the image update rate is slower than the display update rate, images need to be repeated to keep the update rates in sync. The repeated image may produce a noticeable jump for objects in motion, similar to the dropped image. Thus, this technique works well for still image projection, but for movies, sporting events, and other television broadcasts, it is not desirable because of the noticeable jumps.

Another update rate compensation technique is to reset the display update rate to equal the image update rate. While this overcomes the above mentioned difficulty, it creates a new one. When the display update rate is coarsely adjusted for some display devices during a mode change, the screen blanks for a few seconds to reset the display update rate. If the display update rate needs to be changed to initiate video, the blanking of the screen can be quite annoying to the user.

Therefore, a need exists for a method and apparatus that finely adjusts the display update rate without the adverse effects mentioned above and does so in a visually acceptable manner.

DETAILED DESCRIPTION OF THE DRAWINGS

Generally, the present invention provides a method and apparatus for providing very small changes in the output oscillation of a controlled oscillation circuit which may be used in a phase locked loop circuit. This may be accomplished by a phase-shifting controlled oscillator that includes an oscillation circuit and a selection circuit. The oscillation circuit generates a plurality of oscillations that are of approximately the same frequency and are approximately equally phase shifted from one another. The selection circuit is operably coupled to receive the plurality of oscillations and selects one of them to be the output oscillation based on a control signal. The very small change in the output oscillation occurs when the selection circuit, based on the control signal, selects another one of the oscillations to be the output oscillation. When the change happens, a single pulse is stretched by the phase difference between the "old" output oscillation and the "new" output oscillation. With such a method and apparatus, very small changes in the average output frequency can be obtained; approximately 50 PPM for a video timing circuit changing the horizontal timing. When employed in a video graphics circuit, the very small changes in output frequency can be used to change the display update rate to match the image update rate without adverse visual effects.

Figure 1:
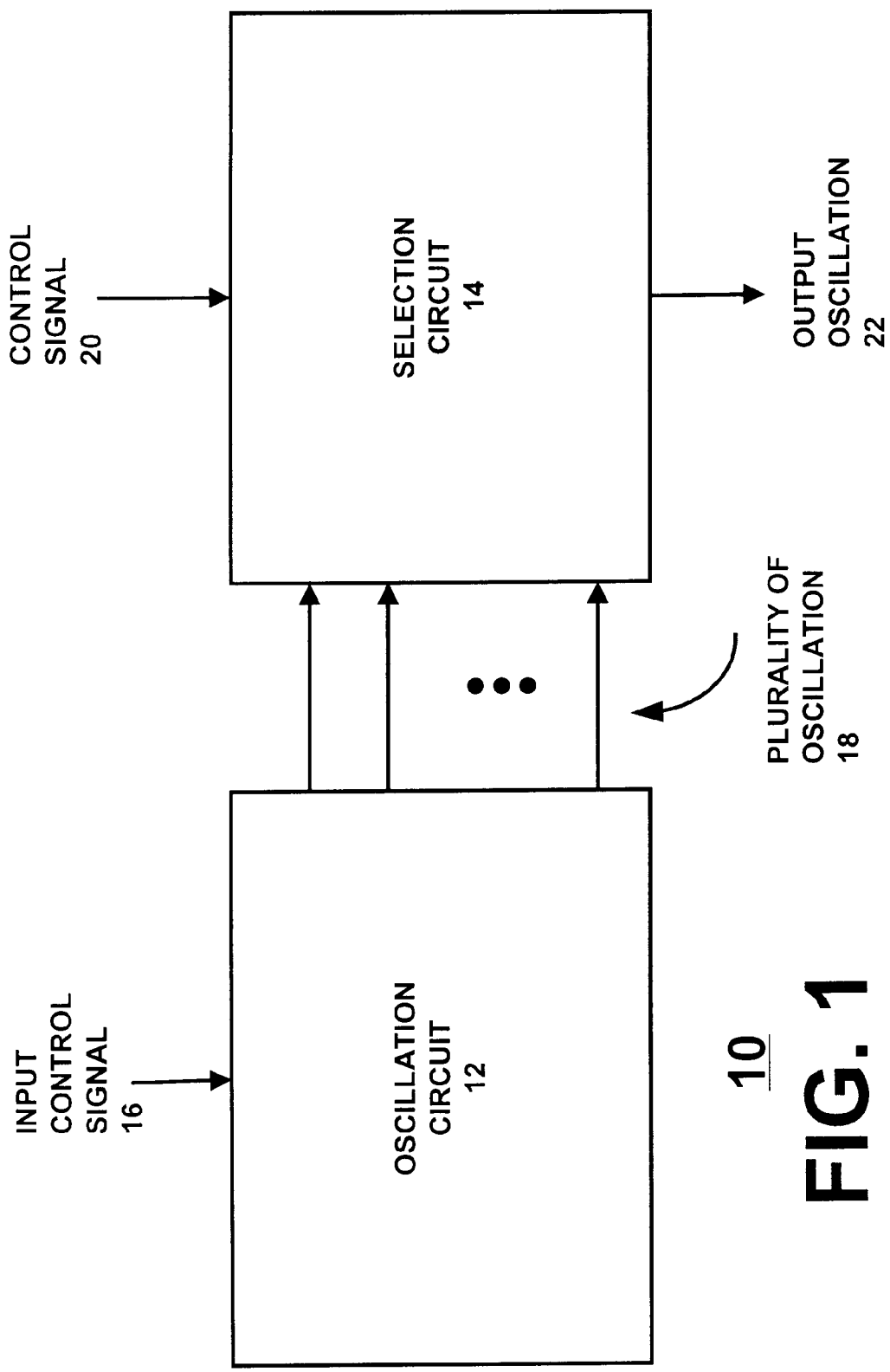
FIG. 1 illustrates a schematic block diagram of a phase-shifting controlled oscillator which is in accordance with the present invention.

The present invention can be more fully described with reference to FIGS. 1–10. FIG. 1 illustrates a schematic block diagram of a phase-shifting controlled oscillator 10 which includes an oscillation circuit 12 and a selection circuit 14. The oscillation circuit 12 is coupled to receive an input control signal 16 and to produce oscillations 18 by oscillators. The frequency of the plurality of oscillations is determined by the value of the input control signal 16 while the phase offset of the plurality of oscillations is determined by the number of oscillations being produced. For example, the input control signal 16 may establish a frequency of 100 MHz and the oscillation circuit is producing five oscillations. The phase shifting of the oscillations would be approximately 360/5, which equals 72 degrees.

The selection circuit 14 is coupled to receive the plurality of oscillations 18 and a control signal 20. Based on the control signal 20, the selection circuit 14 selects one of the plurality of oscillations 18 as the output oscillation 22. The phase-shifting controlled oscillator 10 provides very small adjustments to the output oscillation 22 when the control signal 20 indicates to the selection circuit 14 to select another one of the plurality of oscillations 18. When the change occurs one pulse in the output oscillation is stretched by the phase difference between the old output oscillation and the new one. Using the example above, the pulse would be stretched by $1/5^{th}$ of 10 nSec (the period of 100 MHz) which equals 2 nSec. As such, the output oscillation 22 "slipped" by 2 nSec as it shifted to the new output oscillation.

Figure 2:
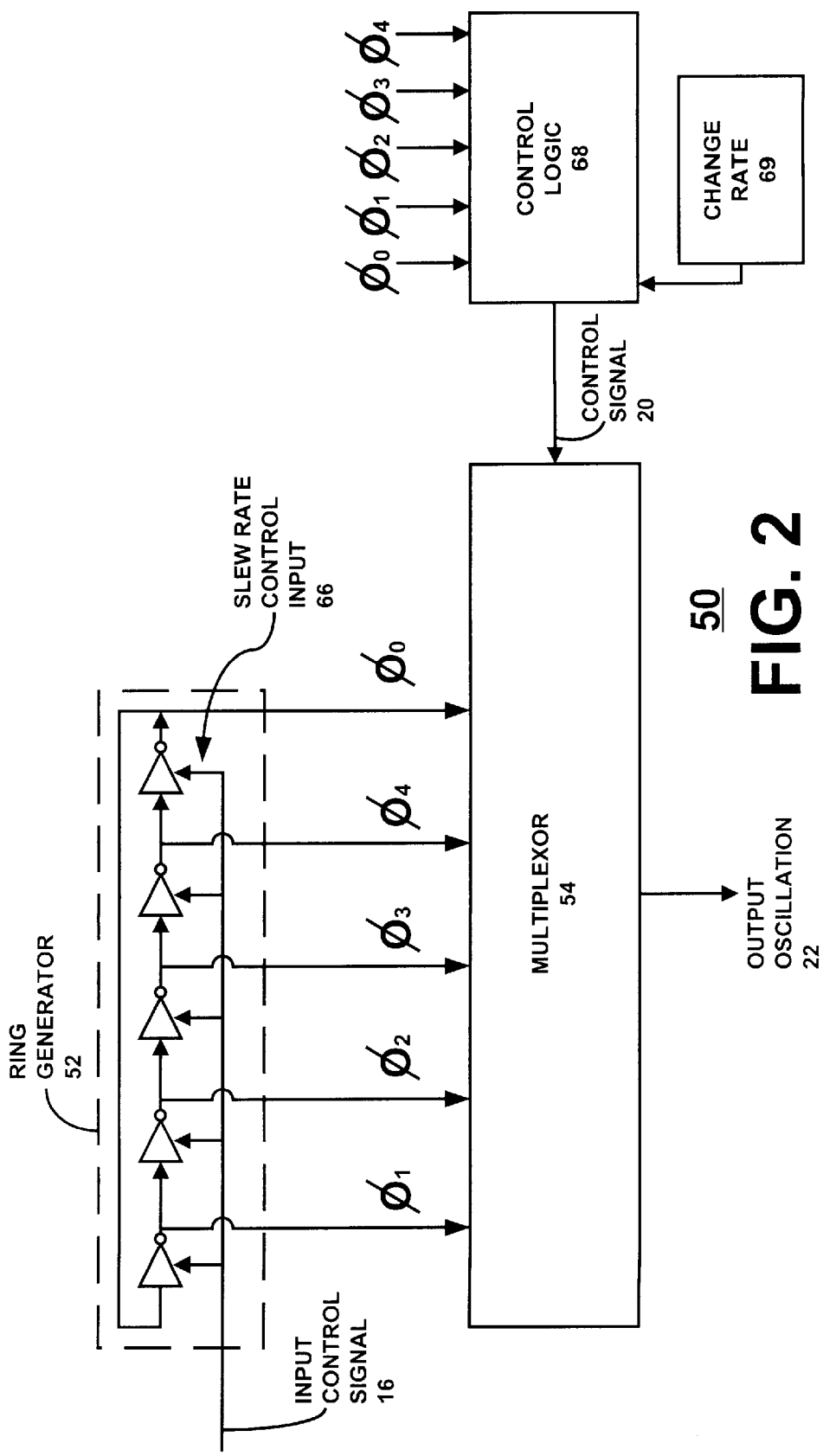
FIG. 2 illustrates a schematic block diagram of an alternate phase-shifting controlled oscillator which is in accordance with the present invention.

FIG. 2 illustrates a schematic block diagram of another alternate phase-shifting controlled oscillator 50 which includes a ring generator 52, a multiplexor 54, and a control logic circuit 68. The ring generator 52 is shown to include a plurality of inverters 56, 58, 60, 62 and 64 inter-operably coupled to produce a pity of oscillations: φ0, φ1, φ2, φ3, and φ4. The input control signal 16, which may be current or voltage, is coupled to the slew rate control input 66 of each of the inverters which controls the speed at which the inverters change states. As one skilled in the art will readily appreciate, the ring generator 52 could include more or less inverters depending on the range of control needed and the desired number of output oscillations. Such a skilled person will also appreciate that not all of the oscillations generated by the ring oscillator need to be tapped, however, if equal phase shifting of the oscillations is desired, all taps would need to outputted.

The control logic circuit 68 is operably coupled to receive the plurality of oscillations and a change rate signal 69. Based on these inputs, the control logic circuit 68 generates the control signal 20, which is used by the multiplexor 54 to select one of the plurality of oscillations to be the output oscillation 22. Depending on the application in which the phase-shifting controlled oscillator 50 is employed, the change rate signal 69 may be produced by a variety of sources. For example, if the oscillator 50 is used in a video graphics circuit, the change rate signal would be produced by an update rate difference detector. A more detailed discussion will be presented below with reference to FIG. 7 and 8.

Figure 3:
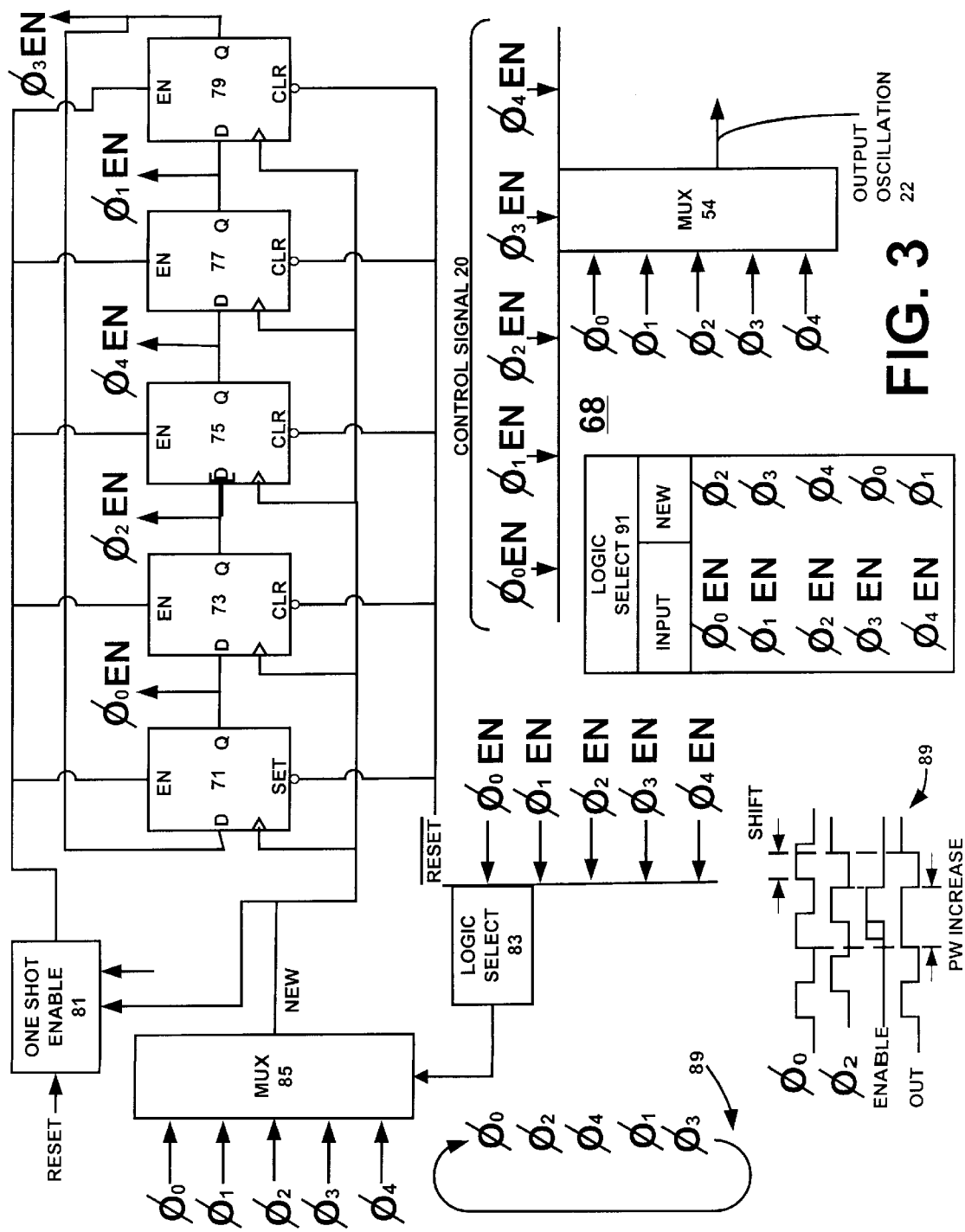
FIG. 3 illustrates a schematic block diagram of a control logic circuit that may be used to control a phase-shifting controlled oscillator, the control logic circuit is in accordance with the present invention.

FIG. 3 illustrates a schematic block diagram of a control logic circuit 68 of FIG. 2. The control logic circuit 68 includes a plurality of flip-flops 71, 73, 75, 77, and 79, a one-shot enable circuit 81, and a clock circuit which is comprised of a multiplexor 85 and a logic select circuit 83. Also shown is a timing diagram 87, a phase shifting cycle 89, a table 91 of the logical operations performed by the logic select circuit 83, and the multiplexor 54.

In operation, the control logic circuit 68 produces the control signal 20 and awaits a change rate signal 69 such that it can provide a new control signal 20 to the multiplexor 54 causing it to select a new output oscillation thereby producing the desired output frequency slipping. As shown, each of the plurality of flip-flops 71, 73, 75, 77, and 79 produce an enable signal: φ0 EN, φ2 EN, φ4 EN, φ1 EN, and φ3 EN that are provided to the multiplexor 54 and the logic select circuit 83. The multiplexor 54 uses these enable signals as the control signal 20 to select the output oscillation. The logic select circuit 83 uses the enable signals to prepare the flip-flops to toggle the active enable signal when the change rate signal 69 is received. Note that the flip-flops are coupled in a certain pattern 89 (Eg. φ0, φ2, φ4, φ1, and φ3) to provide minimal phase shifting between each successive change. Recall from the FIG. 2 that the ring generator 52 is comprises of a plurality of inverters cascaded together. If the cascaded pattern were followed, the incremental step would be approximately 180 degrees, since the next stage is an inversion of the preceding one. As one skilled in the art will readily appreciate, the pattern of the fli-flops may be in any order to provide a desired response.

Assume that φ0 EN is active (Eg. a logic '1'). In this state, the multiplexor 54 is providing φ0 as the output oscillation 22. The logic select circuit 83 is providing φ2 as the controlling signal to multiplexor 85 such that it selects φ2 as its output, which will be the "new" output oscillation. While the new output oscillation is provided as the clock signal to the plurality of flip-flops, the flip-flops do not toggle because the enable signal is held low by the one-shot enable circuit 81. Thus, φ0 EN remains active, while the other enable signals are held inactive (E. a logic '0'). The control circuit 68 will stay in this steady state condition until a change rate signal is received.

When the change rate signal 69 is received, the one-shot enable circuit 81 is activated, thus enabling the flip-flops to toggle at the next clock cycle. As coupled, the next clock cycle is generated by the new output oscillation and the φ2 flip-flop now produces an active enable signal, while the others are inactive. After one clock cycle, the one-shot enable circuit returns to an inactive state, preventing the flip-flops from toggling. With φ2 EN being active, multiplexor 54 now outputs φ2 as the output oscillation 22 and the logic select circuit 83 selects the next new output oscillation: φ4. The control circuit 68 quickly reaches this steady state condition and remains there until the next change rate signal 69 is received.

During the transition state is when the output oscillation, in a sense, slips as it changed from the currently selected, or old, output oscillation to the new output oscillation. Time diagram 87 illustrates this point. As shown, φ0 and φ2 oscillations are output of phase by ($^{360}/_5$) or 72 degrees. When the change rate signal 69 is received, it enables the one-shot, thus producing an enable signal. Because φ2 is the clock for the plurality of flip-flops, the output oscillation 22 will start out as a φ0 oscillation, but will end as a +2 oscillation. A closer study of the circuitry will reveal how this transition occurs.

When the one-shot provides the enable signal, the flip-flops will toggle at the next clock cycle, which is the leading edge of φ2. At this point, the φ2 flip-flop 73 toggles producing a logic one output while the φ0 flip-flop 71 produces a logic zero output. When this transition occurs, multiplexor 54 is provided with a control signal of φ0 EN and φ2 EN, thereby switching the output oscillation to the φ2 oscillation before the φ0 oscillation ends, thus producing a single pulse that has a stretched, or increased, pulse width. When the circuits of FIG. 2 and 3 are employed in a video graphics circuit that drives a screen of 800×600 pixels at 59.94 Hz, this subtle change changes the clocks per line by about 48 PPM, which, when done for the entire display, allows the video graphics circuit to adjust the display update rate once per line, or at a less often rate, to match, over time, the image update rate without adverse visual effects.

Figure 4:
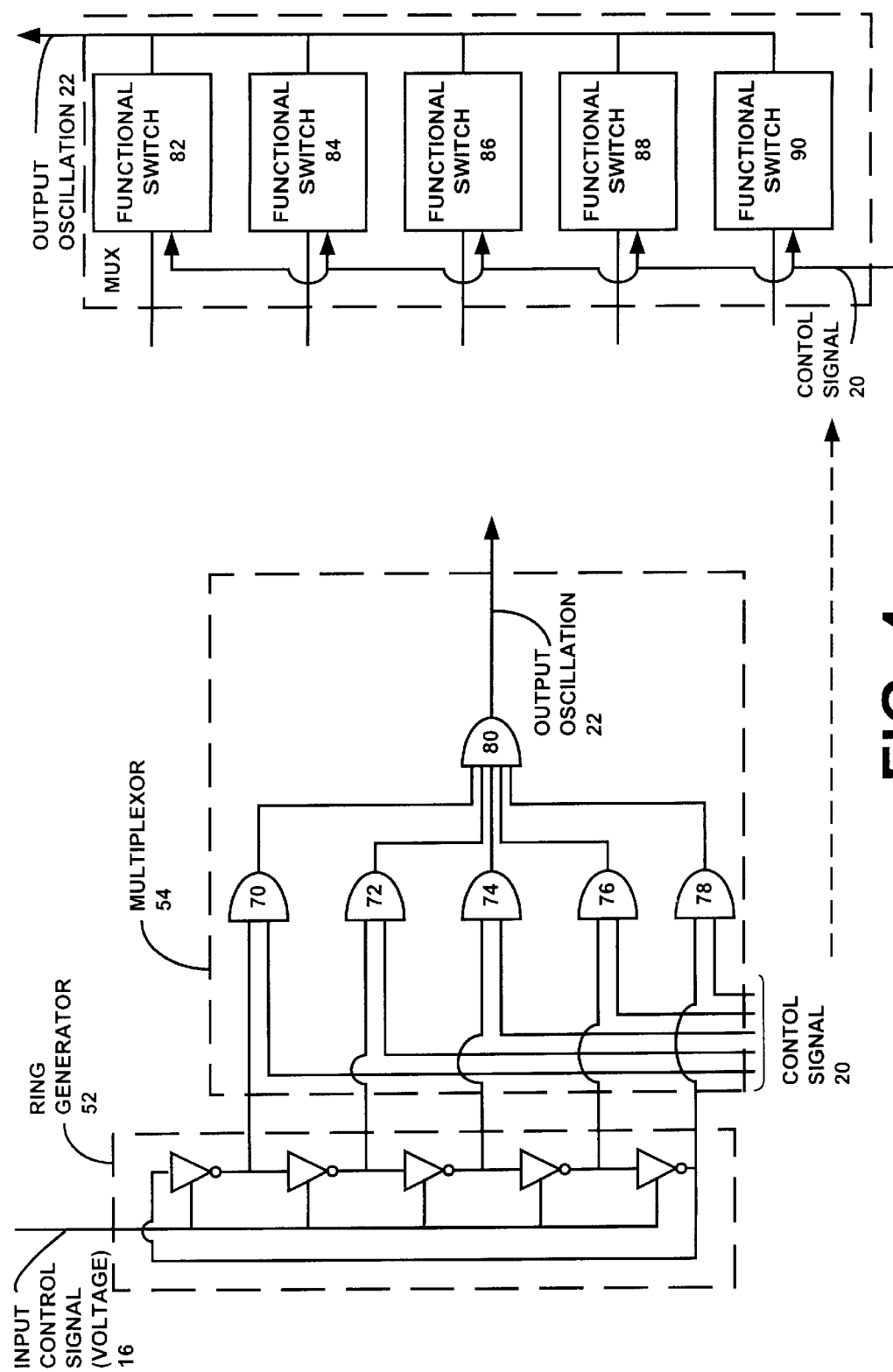
FIG. 4 illustrates a schematic block diagram of the phase-shifting controlled oscillator of FIG. 2 with various implementations of the multiplexor which is in accordance with the present invention.

FIG. 4 illustrates a schematic block diagram of the phase-shifting controlled oscillator 50 of FIG. 3 with various implementations of the multiplexor 54. In a first multiplexor implementation, the multiplexor 54 is shown to include a plurality of AND gates 70, 72, 74, 76, and 78 coupled to an OR gate 80. Each of the AND gates receives, as inputs, one of the plurality of oscillations and one of the control signals 20. With one of the control signals high, the associated AND gate provide its oscillation to the OR gate, thereby providing the output oscillation 22. When the control signal changes, another AND gate will provide its oscillation to the OR gate, and during the transition, both AND gates will provide their oscillations to the OR gate, thereby producing the output oscillation slip as discussed above. As one skilled in the art will readily appreciate, the AND-OR combination of the present diagram may be replaced with a NOR—NOR combination The second implementation shows the multiplexor 54 comprising a plurality of functional switches 82, 84, 86, 88, and 90. These functional switches are coupled to receive the control signal 20 and to receive the plurality of oscillations. As one skilled in the art will readily appreciate, the functional switches may be implemented in a variety of ways. For example, they may be transistors, tri-state buffers, logical circuits, transmission gates, bounceless switches, etc.

Figure 5:
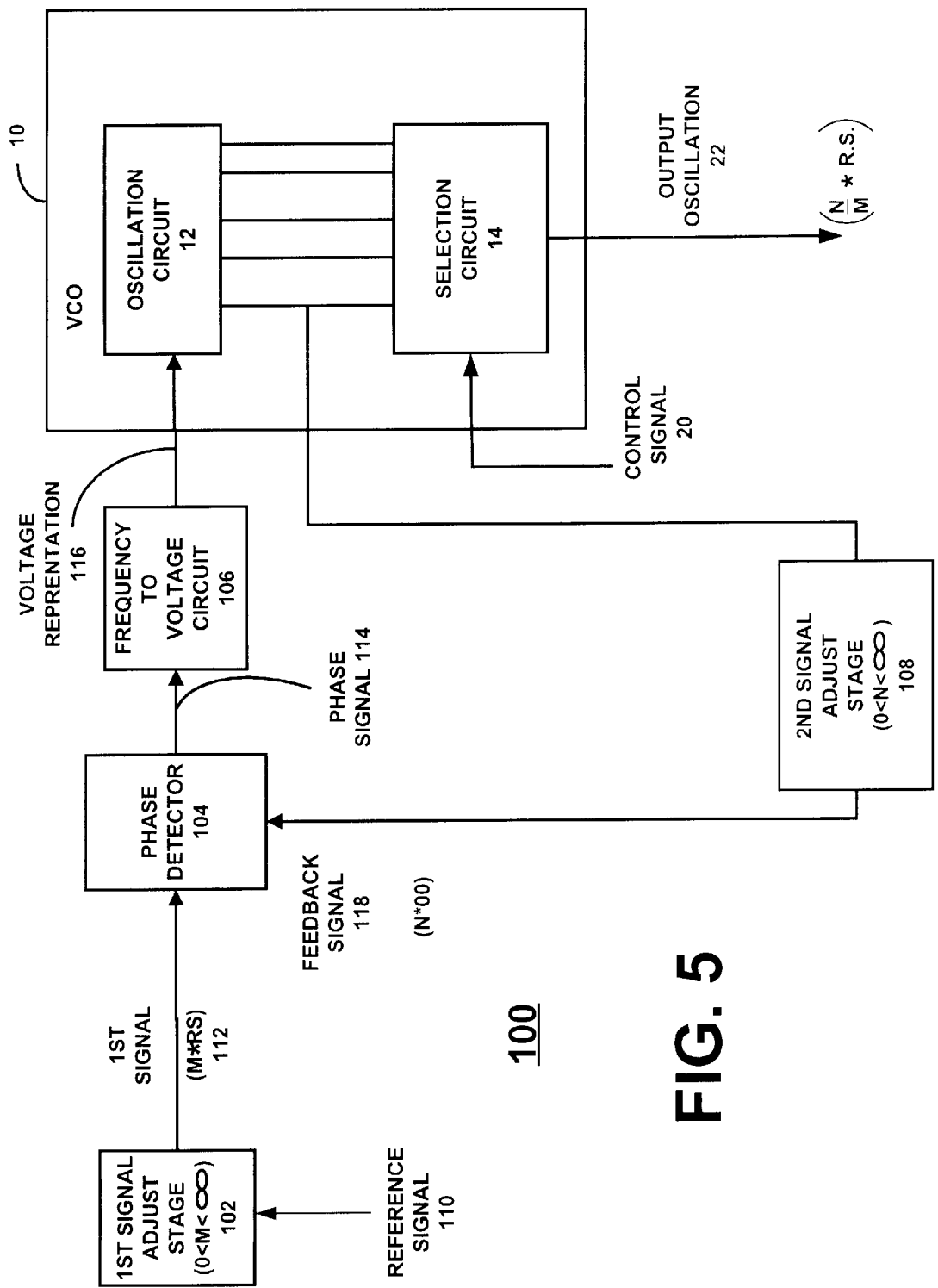
FIG. 5 illustrates a schematic block diagram of a phase locked loop that incorporates a phase-shifting controlled oscillator, such an implementation is in accordance with the present invention.

FIG. 5 illustrates a schematic block diagram of a phase locked loop (PLL) 100 that incorporates a phase-shifting controlled oscillator 10 and further includes a first signal adjust stage 102, a phase detector 104, a frequency to voltage circuit 106 (which may be charge pump circuit), and a second signal adjust stage 108. In general, the PLL 100 receives a reference signal 110 and produces, therefrom, an output oscillation 22, which is related to the reference signal 110 by the adjusting values of the first and second stages 102 and 108. For example, assume that the reference signal 110 is a 14 MHz clock signal, the first adjust value is divide by 70 and the second adjust value is divide by 500. From these values, the output oscillation will be 100 MHz (i.e., ($^{500}/_{70}$) *14 MHz).

In operation, the first adjust stage 102 receives the reference signal 110 and produces, therefrom, a first signal 112, which is M* (RS), or (RS)/M for dividers, where 0 <M>∞. The second stage 108 receives a fixed one of the plurality of oscillations from the oscillation circuit 12 and produces, therefrom, a feedback signal 118, which is N* (OO), or (OO)/N for dividers, where 0<N>∞. These two signals 112 and 118 are provided to the phase detector 104 which generates a phase signal 114 from the differences in phase between the two signals 112 and 118. For example, if the feedback signal 118 leads the first signal 112, the phase signal 114 will be a pulse causing a decrease in the VCO frequency. Conversely, when the feedback signal 118 lags the first signal 112, the phase signal 114 will be a pulse causing an increase in the VCO frequency. The phase signal 114 is converted into a voltage signal 116 by the frequency to voltage circuit 106, where the voltage signal 116 is used to control the frequency of the plurality of oscillations.

When a change in control signal 20 occurs, the output oscillation 22 slips as previously discussed. The oscillation provided to the second stage 108, however, does not slip because it is coupled to a fixed one of the plurality of oscillations. In this implementation, the feedback loop remains unaltered, thereby assuring stability as the output oscillation is changed.

Figure 6:
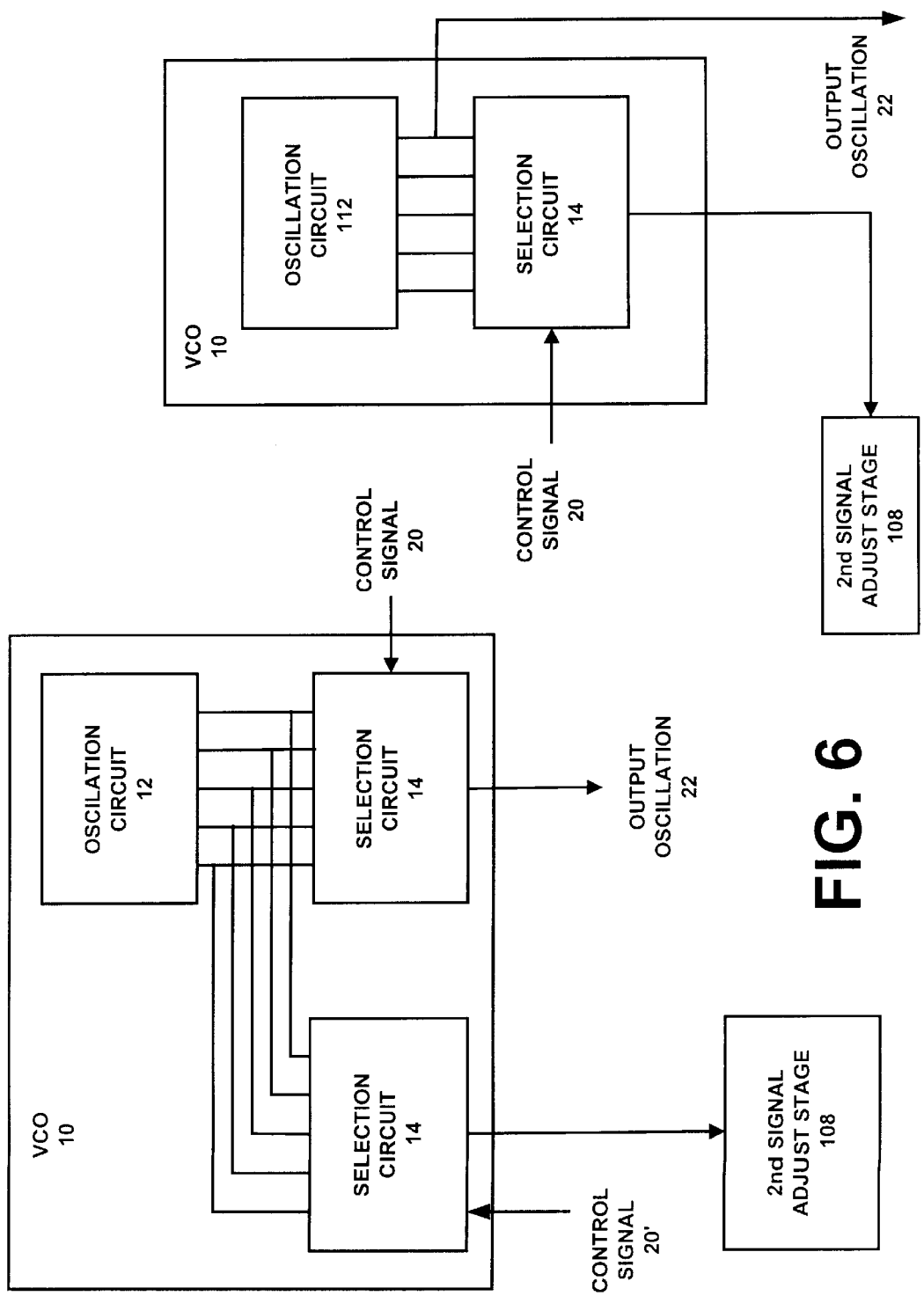
FIG. 6 illustrates a schematic block diagram of alternate coupling of the phase-shifting controlled oscillator within the phase locked loop, such alternate coupling is in accordance with the present invention.

FIG. 6 illustrates a schematic block diagram of alternate coupling of the phase-shifting controlled oscillator 10 within the phase locked loop 100. The first coupling alternative has the phase-shifting controlled oscillator 10 comprising an oscillation circuit 12 and two selection circuits 14. One of the selection circuits provides the output oscillation 22, while the other is fed to the second stage 108. In this embodiment, two control logic circuits would be used to produce the control signals 20 and 20'.

In the second coupling alternative, the output oscillation 22 is coupled to a fixed one of the plurality of oscillations, while the output of the selection circuit 14 is coupled to the second stage circuit 108. In this embodiment, the output frequency remains fixed and is subtly adjusted over time due to the change in the feedback path via the second signal adjust stage 108. As previously mentioned, a subtle change in the output frequency is obtained by slipping the output oscillation very infrequently. When the slipping is done in the feedback path, the M:N ratio changes by a very small percentage. For example, if the M is 70 and N is 500, the M:N ratio is 70:500. But, if the feedback loop slips once per 500 counts of the output oscillation (recall that divide by N is done by a counter), N now equals 500 and $^1/_{500}$th or 500.002. This small change in the M:N ratio yields the desired subtle changes such that the display update rate may be adjusted over time to match the image update rate of video images to be displayed.

Figure 7:
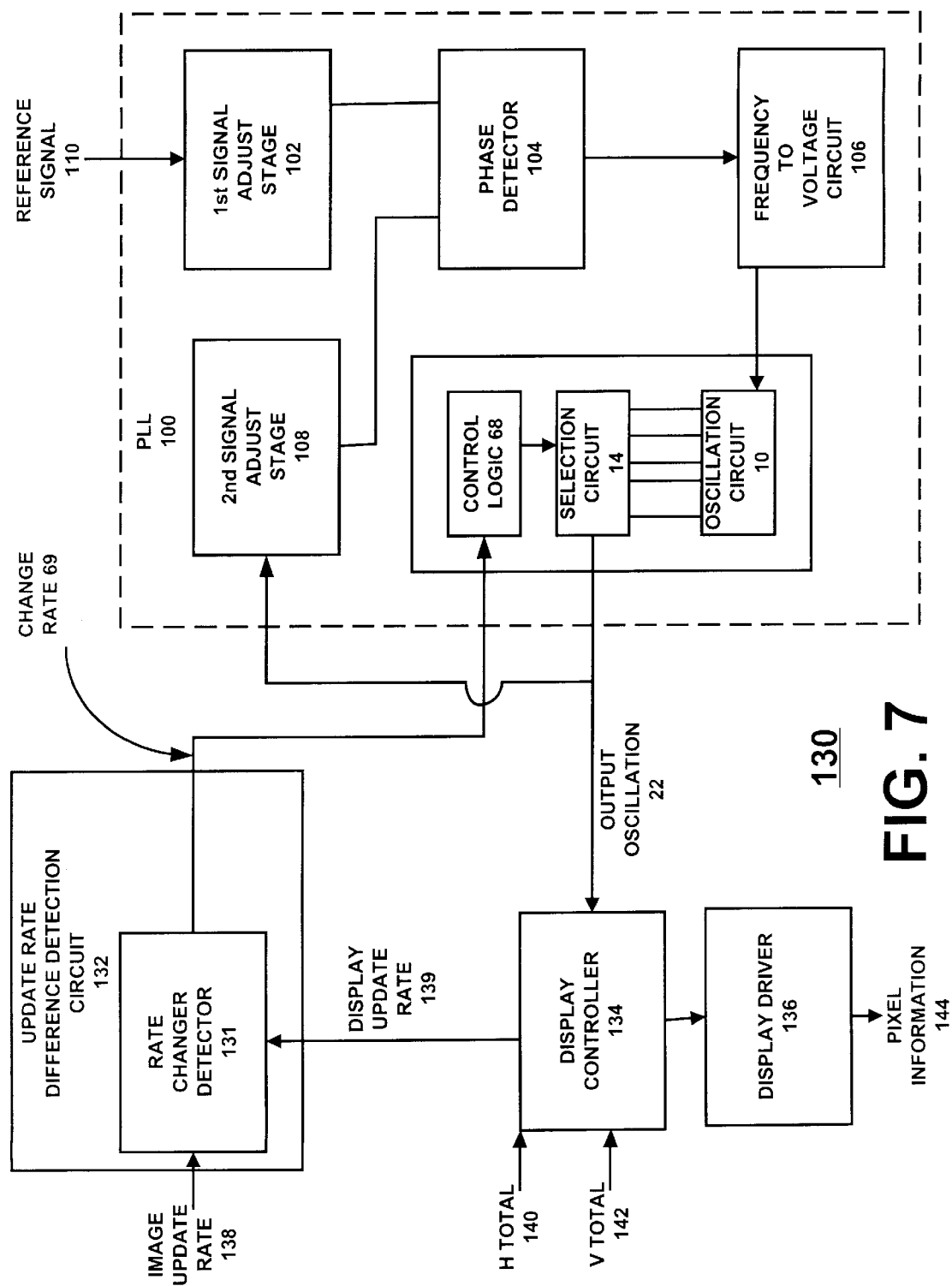
FIG. 7 illustrates a schematic block diagram of a video graphics circuit that includes a phase locked loop employing a phase-shifting controlled oscillator, the video graphics circuit is in accordance with the present invention.

FIG. 7 illustrates a schematic block diagram of a video graphics circuit 130 that includes a phase locked loop 100 employing a phase-shifting controlled oscillator 10. The video graphics circuit 130 further includes an update rate difference detection circuit 132, a display controller 134, and a display driver 136. In operation, the display controller 134 produces a display update rate 139 based on the output oscillation 22, a horizontal line total value 140, and a vertical line total value 142. The display update rate 139, along with video graphics information, is provided to the display driver 136 which produces, therefrom, pixel information 144.

The update rate difference detection circuit 132 includes a rate change detector 131 that, upon receiving an image update rate 138 and the display update rate 139, produces the change rate signal 69. The change rate signal 69 is only active when the image update rate 138 and the display update rate 139 don't match. When this occurs, the change rate signal 69 is received by the PLL 100 and changes the output oscillation ever so slightly to avoid adverse visual effects. The change in the output oscillation occurs as discussed above.

Figure 8:
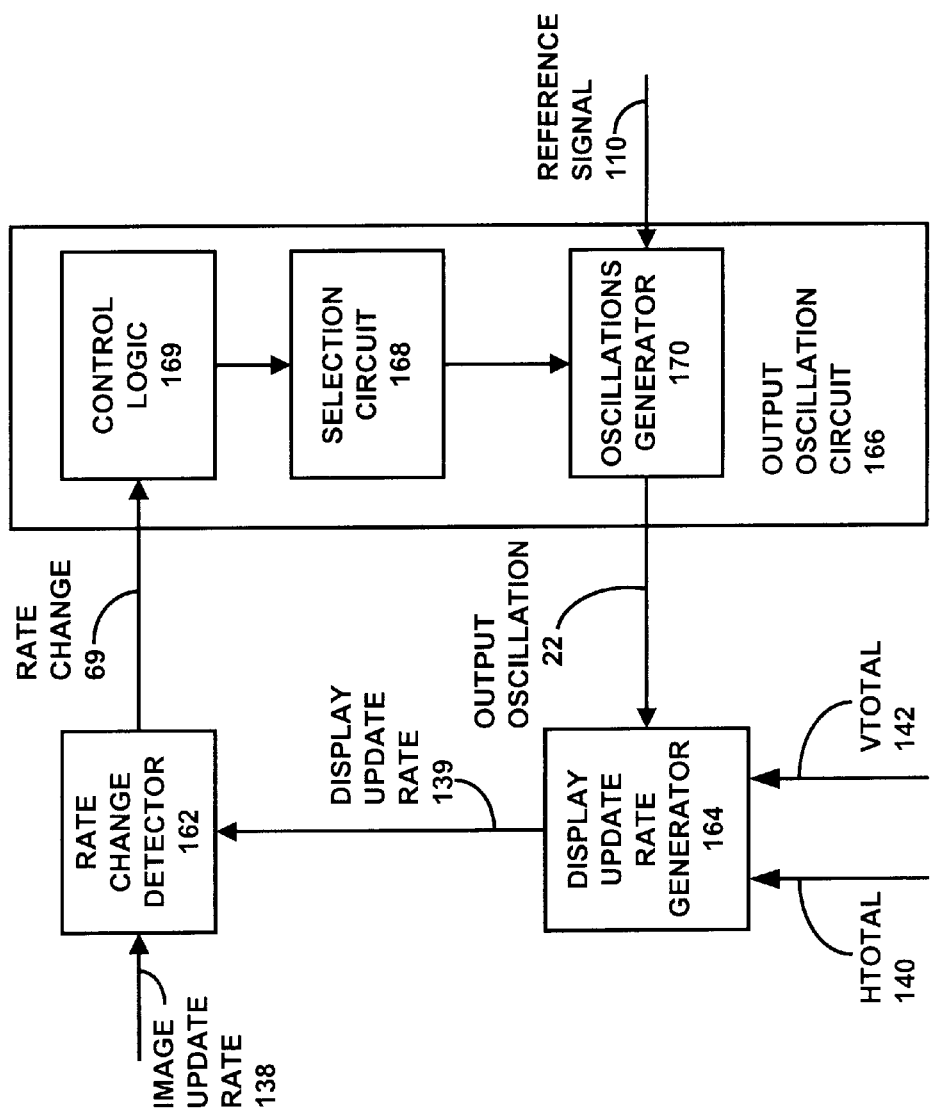
FIG. 8 illustrates a schematic block diagram of an alternate video graphics circuit which in accordance with the present invention.

FIG. 8 illustrates a schematic block diagram of an alternate video graphics circuit 160 which includes a rate change detector 162, a display update rate generator 164, and an output oscillation circuit 166. The output oscillation circuit 166 includes a control logic circuit 169, a selection circuit 168, and an oscillations generator 170. The oscillations generator 170 produces a plurality of oscillations based on a reference signal 110 and outputs a particular one 22 of the oscillations based on a selection signal from the selection circuit 168. The control logic circuit 169 generates a control signal, which is supplied to the selection circuit 168, from the change rate signal 69.

As shown, the display update rate generator 164 receives the output oscillation 22, a horizontal line total signal 140, and a vertical line total signal 142 and produces, therefrom, the display update rate 139. The display update rate 139 is compared with the image update rate 138 to produce the change rate signal 69 when they don't match. The change rate signal 69 causes the control logic 169 to provide a control signal to the selection circuit that, in turn, causes the selection circuit to select a different one of the plurality of oscillations, which changes the output oscillations and finally changes the display update rate to match, over time, the image update rate.

Figure 9:
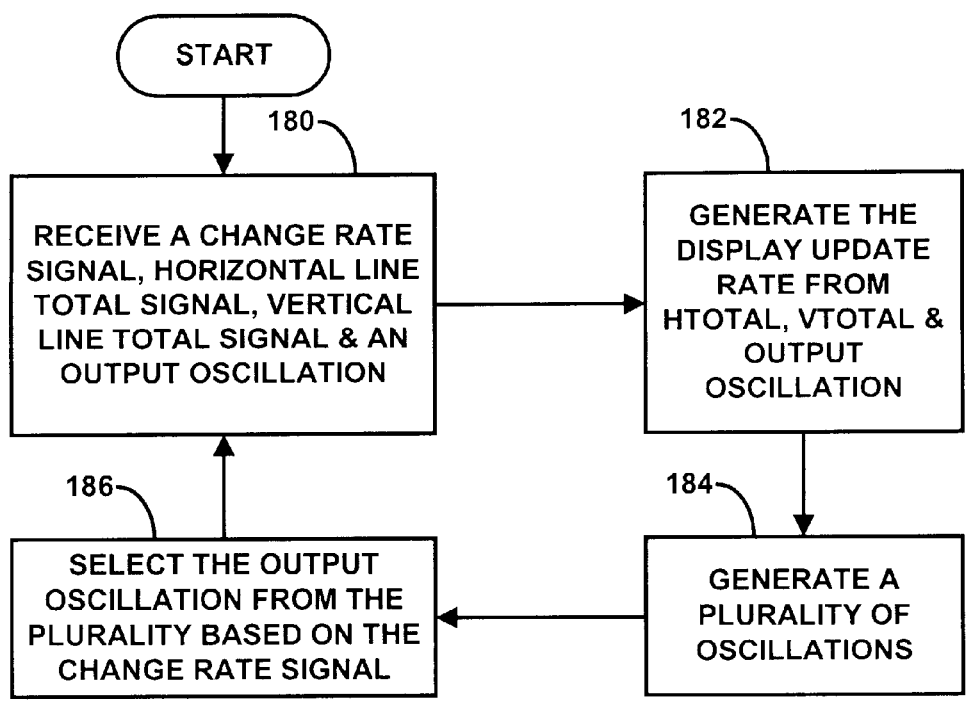
FIG. 9 illustrates a logic diagram that may be used to implement a video graphics circuit employing a phase-shifting controlled oscillator in accordance with the present invention.

FIG. 9 illustrates a logic diagram that may be used to implement a video graphics circuit employing a phase-shifting controlled oscillator. The process begins at step 180 where a change rate signal, a horizontal line total signal, a vertical line total signal, and an output oscillation are received. The process then proceeds to step 182, where the display update rate is generated from the horizontal fine total signal, the vertical line total signal, and the output oscillation. The process then proceeds to step 184, where a plurality of oscillations are generated, such generation on may be done as described above. The process then proceeds to step 186, where one of the plurality of oscillations is selected based on the change rate signal, which may be produced as described above. The process then repeats at step 180 and remains in this continual loop making adjustments to the output oscillation when the display update rate needs to be changed.

Figure 10:
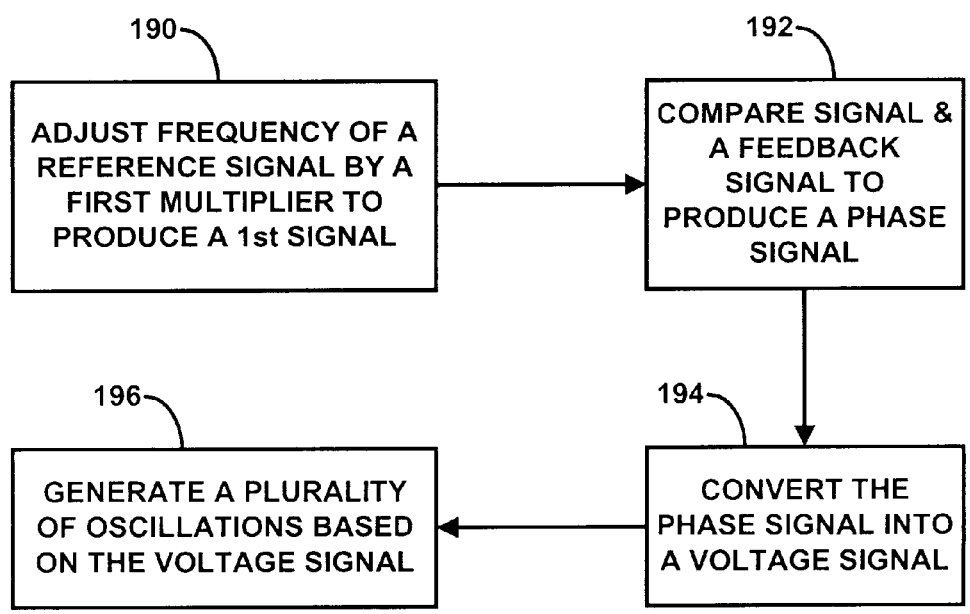
FIG. 10 illustrates a logic diagram that may be used to generate a plurality of oscillations in accordance with the present invention.

FIG. 10 illustrates a logic diagram that may be used to generate a plurality of oscillations. The process begins at step 190, where the frequency of a reference signal is adjusted by a first multiplier to produce a first signal. The first multiplier M may be in a fractional value (i.e., the first multiplier is a divider) or an integer value. The process then proceeds to step 192, where the first signal is compared with a feedback signal to produce a phase signal. The process then proceeds to step 194, where the phase signal is converted into a voltage signal. Finally, the process proceeds to step 196, where a plurality of oscillations are generated based on the vole signal. As one skilled in the art will readily appreciate, the oscillation circuit of any of the embodiments presented herein could be current controlled.

The preceding discussion has presented a method and apparatus for making very subtle changes to an output oscillation of a controlled oscillator that provides a fractional feedback divider which yields a more accurate synthesized clock having a fixed period and/or a variable phase output. Such a controlled oscillator may be used in a video graphics circuit PLL to allow a display update rate to be changed so subtly that negligible adverse visual affects are produced. Thus, the present invention may be most effective in a video graphics circuit that processes video images that have an image display rate that is different than the display update rate.

What is claimed is:

1. A phase-shifting controlled oscillator comprising:
    an oscillation circuit that generates a plurality of oscillations, wherein the plurality of oscillations are of an approximately identical frequency and are approximately equally phase shifted, and wherein the approximately identical frequency is based on an input control signal; and
    a selection circuit operably coupled to receive the plurality of oscillations from the oscillation circuit, wherein the selection circuit provides one of the plurality of oscillations as an output oscillations based on a control signal that is derived from a change rate signal and at least one of the plurality of oscillations, wherein the change rate signal is active when an image update rate does not match a display update rate.

2. The phase-shifting controlled oscillator of claim 1 further comprises, within the oscillation circuit, a plurality of oscillators inter-operably coupled to generate the plurality of oscillations.

3. The phase-shifting controlled oscillator of claim 1 further comprises, within the selection circuit, a multiplexor operably coupled to receive the plurality of oscillations and the control signal.

4. A phase-shifting controlled oscillator comprising:
    a ring generator that includes a plurality of inverters cascaded together, wherein the plurality of inverters are operably coupled to receive an input control signal that establishes a frequency of the ring generator, and wherein at least some interconnections between the plurality of inverters provide a plurality of oscillations;
    control logic circuit operably coupled to the ring generator and operably coupled to receive a change rate signal, wherein the control logic circuit generates a control signal based on the change rate signal and the plurality of oscillations, wherein the change rate signal is active when an image update rate does not match a display update rate; and
    multiplexor operably coupled to receive the plurality of oscillations and to receive the control signal, wherein the multiplexor provides one of the plurality of oscillations as an output oscillation based on the control signal.

5. The phase-shifting controlled oscillator of claim 4 further comprises, within the multiplexor, a plurality of functional switches, wherein each of the plurality of functional switches is coupled to receive a corresponding one of the plurality of oscillations, and wherein one of the plurality of functional switches is activated by the control signal to provide the output oscillation.

6. The phase-shifting controlled oscillator of claim 4 further comprises, within the multiplexor, a plurality of AND gates and an OR gate, wherein each of the plurality of AND gates has as inputs, one of the plurality of oscillations and the control signal, and wherein each output of the plurality of AND gates provides inputs to the OR gate.

7. The phase-shifting controlled oscillator of claim 4 further comprises, within the ring generator, five inverters cascaded together, wherein the input control signal is received by a slew rate control input of each of the plurality of inverters.

8. The phase-shifting controlled oscillator of claim 4 further comprises, within the control logic circuit:

a plurality of flip-flops inter-operably coupled to provide the control signal;

a one-shot enable circuit operably coupled to the plurality of flip-flops and to receive the change rate signal, wherein the one-shot provides an enable signal to the plurality of flip-flops such that the flip-flops change the control signal; and clock circuit operably coupled to the plurality of flip-flops, wherein the clock circuit provides a clock signal to the plurality of flip-flops based on the output oscillation.

9. A Phase Locked Loop comprising:

a first signal adjust stage operably coupled to receive a reference signal, wherein the first signal adjust stage provides a first signal which has a frequency that is representative of a multiple of a given frequency of the reference signal;

a phase detector operably coupled to receive the first signal and a feedback signal, wherein the phase detector produces from the first signal and the feedback signal a phase signal;

a frequency to voltage circuit operably coupled to receive the phase signal and produce a voltage representation thereof;

a voltage controlled oscillator operably coupled to receive the voltage representation and to produce, therefrom, an output oscillation, the voltage controlled oscillator includes:

an oscillation circuit that generates a plurality of oscillations, wherein the plurality of oscillations are of an approximately identical frequency and are approximately equally phase shifted, and wherein the approximately identical frequency is based on the voltage representation;

control logic circuit operably coupled to the oscillation circuit and operably coupled to receive a change rate signal, wherein the control logic circuit generates a control signal based on the change rate signal and the plurality of oscillations; and a selection circuit operably coupled to receive the plurality of oscillations from the oscillation circuit, wherein the selection circuit provides, based on the control signal, one of the plurality of oscillations as the output oscillation; and a second signal adjust stage operably coupled to receive the output oscillation and to produce, therefrom, the feedback signal.

10. The Phase Locked Loop of claim 9 further comprises, within the first signal adjust stage, a divider circuit that divides, by a factor of M, the given frequency of the reference signal.

11. The Phase Locked Loop of claim 10 further comprises, within the second signal adjust stage, a divider circuit that divides, by a factor of N, the output oscillation such that the output oscillation is a function of M,N, and the reference signal.

12. A video graphics circuit comprising:

an update rate difference detection circuit operably coupled to receive an image update rate and a display update rate and to produce, therefrom, a control signal;

a display controller operably coupled to receive a horizontal line total signal, a vertical line total signal, and an output oscillation and to produce, therefrom, the display update rate; and a Phase Locked Loop operably coupled to provide the output oscillation, the Phase Locked Loop includes:

a first signal adjust stage operably coupled to receive a reference signal, wherein the first signal adjust stage provides a first signal which has a frequency that is representative of a multiple of a given frequency of the reference signal;

a phase detector operably coupled to receive the first signal and a feedback signal, wherein the phase detector produces a phase signal from the first signal and the feedback signal;

a frequency to voltage circuit operably coupled to receive the phase signal and produce a voltage representation thereof;

a voltage controlled oscillator operably coupled to receive the voltage representation and to produce, therefrom, an output oscillation, the voltage controlled oscillator includes:

an oscillation circuit that generates a plurality of oscillations, wherein the plurality of oscillations are of an approximately identical frequency and are approximately equally phase shifted, and wherein the approximately identical frequency is based on the voltage representation;

control logic circuit operably coupled to the oscillation circuit and operably coupled to receive a change rate signal, wherein the control logic circuit generates a control signal based on the change rate signal and the plurality of oscillations; and a selection circuit operably coupled to receive the plurality of oscillations from the oscillation circuit, wherein the selection circuit provides, based on the control signal, one of the plurality of oscillations as the output oscillation; and a second signal adjust stage operably coupled to receive the output oscillation and to produce, therefrom, the feedback signal.

13. The video graphics circuit of claim 12 further comprises, within the update rate difference detection circuit, a rate change detector that, based on differences between the image update rate and the display update rate, generates the change rate signal.

14. The video graphics circuit of claim 12 further comprises a display driver operably coupled to the display controller, wherein the display driver provides pixel information to a display.

15. A method for processing video graphic data comprising the steps of:

a) receiving a change rate signal, wherein the change rate signal is used to maintain negligible differences between an image update rate and a display update rate;

b) receiving a horizontal line total signal, a vertical line total signal, and an output oscillation;

c) generating the display update rate from the horizontal line total signal, the vertical line total signal, and the output oscillation;

e) generating a plurality of oscillations; and f) selecting the output oscillation from the plurality of oscillations based on the change rate signal.

16. The method of claim 15 further comprises, within the generating the plurality of oscillations step, the steps of:

i) adjusting frequency of a reference signal by a first multiplier to produce a first signal which has a frequency that is representative of the multiplier and the frequency of the reference signal;

ii) comparing phase of the first signal and phase of a feedback signal to produce a phase signal;

iii) converting frequency of the phase signal to a voltage signal; and iv) generating the plurality of oscillations based on the voltage signal, wherein the plurality of oscillations are of an approximately identical frequency and are approximately equally phase shifted.

17. A circuit for processing video data comprising:

rate change detector that produces a change rate signal, wherein the change rate signal is generated, and subsequently used, to maintain negligible differences between an image update rate and a display update rate;

display update rate generator that generates a display update rate from a horizontal line total signal, a vertical line total signal, and an output oscillation; and output oscillator that produces a plurality of oscillations and selects one of the plurality of oscillations as the output oscillation based on the change rate signal.

18. The circuit of claim 17 further comprises, within the output oscillator:

oscillations generator operably coupled to receive a reference signal and to produce, therefrom, the plurality of oscillations, wherein the plurality of oscillations are of an approximately identical frequency and are approximately equally phase shifted;

control logic circuit operably coupled to the oscillations generator and operably coupled to receive the change rate signal, wherein the control logic circuit generates a control signal based on the change rate signal and the plurality of oscillations; and selection circuit operably coupled to receive the control signal and select, based on the control signal, the one of the plurality of oscillations.

\* \* \* \* \*